United States Patent
Watson

(10) Patent No.: US 6,648,509 B2
(45) Date of Patent: Nov. 18, 2003

(54) FRICTION-DRIVE STAGE

(75) Inventor: Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/930,085

(22) Filed: Aug. 15, 2001

(65) Prior Publication Data

US 2003/0035599 A1 Feb. 20, 2003

(51) Int. Cl.$^7$ ............................................. F16C 19/00
(52) U.S. Cl. ......................... 384/58; 384/9; 476/67
(58) Field of Search .................... 74/89; 384/9, 58, 384/53; 476/67

(56) References Cited

U.S. PATENT DOCUMENTS

| | | | | |
|---|---|---|---|---|
| 4,378,709 A | * | 4/1983 | Chitayat ........................ 74/89 |
| 4,550,626 A | * | 11/1985 | Brouwer ...................... 74/409 |
| 4,623,201 A | * | 11/1986 | Gallone ........................ 384/53 |
| 4,757,725 A | * | 7/1988 | Beugin ......................... 74/422 |
| 4,796,458 A | * | 1/1989 | Schubert ....................... 72/420 |
| 5,026,176 A | * | 6/1991 | Jensen et al. .................. 384/53 |
| 5,345,832 A | * | 9/1994 | Takei ............................ 74/89 |
| 5,528,118 A | | 6/1996 | Lee .......................... 318/568.17 |
| 5,623,853 A | | 4/1997 | Novak et al. ............. 74/490.09 |
| 5,668,672 A | | 9/1997 | Oomura ....................... 359/727 |
| 5,689,377 A | | 11/1997 | Takahashi ..................... 359/727 |
| 5,835,275 A | | 11/1998 | Takahashi et al. ........... 359/629 |
| 5,836,205 A | * | 11/1998 | Meyer ....................... 74/89.17 |
| 5,874,820 A | | 2/1999 | Lee .............................. 318/575 |
| 6,145,395 A | * | 11/2000 | Swanson et al. ............ 74/89.33 |
| 6,457,864 B1 | * | 10/2002 | Chang et al. .................. 384/9 |

FOREIGN PATENT DOCUMENTS

| | | | | |
|---|---|---|---|---|
| GB | 2065824 | * | 7/1981 | ..................... 74/27 |
| JP | 02154853 | * | 6/1990 | ................... 476/67 |
| JP | 04000047 | * | 1/1992 | ................... 476/67 |
| JP | 05126223 | * | 5/1993 | |
| JP | 11247955 | * | 9/1999 | |

* cited by examiner

Primary Examiner—Christopher P. Schwartz
Assistant Examiner—Devon Kramer
(74) Attorney, Agent, or Firm—Beyer Weaver & Thomas, LLP

(57) ABSTRACT

An xy stage assembly having an xy stage supported by support shafts and having preload shafts applying a load to the xy stage. The support shafts or the preload shafts can be drive shafts that drive the xy stage in the x direction. The support shafts and the preload shafts are supported by journal/bearing structures that are individually translatable in the z-direction to selectively provide a pitch, roll or z-axis displacement to the xy stage. The support shafts and the preload shafts can be individually translated in the y-direction to provide yaw to the xy stage. Either the support shafts or the preload shafts or both can have wheels that ride in grooves in the xy stage. Alternatively, either the support shafts or the preload shafts or both can have grooves in the circumference of the shafts and the xy stage has rails in which the grooves on the shafts ride. The xy stage may be divided into two section joined by a compressive layer. The xy stage may have a compliant contact layer to provide higher traction between the shaft and the xy stage. The xy stage may have separate drive shafts to drive a belt that provides additional traction between the drive shafts and the xy stage.

12 Claims, 9 Drawing Sheets

FRICTION-DRIVE STAGE

FIELD OF THE INVENTION

This invention relates generally to precision motion devices. More particularly, this invention relates to precision motion devices that can be made of non-metallic materials and that can be used in a vacuum environment. Even more particularly, this invention relates to precision motion devices that have drive actuators located outside the stage and vacuum chamber.

BACKGROUND OF THE INVENTION

Precision motion devices are well known; they are typically used in machine tools and other applications where two-dimensional precise movement is needed to position an object. One application of a precision motion device is as an xy stage used in lithography equipment for the manufacture of semiconductor integrated devices. In lithography systems, an xy stage is typically used to position in two dimensions either a reticle (mask) or a semiconductor wafer. A lithography system includes a source of radiant energy for illumination such as a mercury lamp or other types of lamps or laser or electron-beam sources and a lens system to focus the radiation, which is directed through the reticle onto a substrate such as a semiconductor wafer. The lens system in a photolithography system is an optical lens system and in an electron-beam lithography system the lens system is an assembly of magnetic coils and/or electrostatic elements.

As current semiconductor integrated devices have become more complex and smaller, the required accuracy of the precision motion devices has had to be substantially increased. Such accuracy may be achieved by, for example, electron-beam lithography systems. However, electron-beams can be degraded by dynamic variation in magnetic fields. Such varying fields can be caused by disturbances in the magnetic field along the lens axis. These variations can be caused by, for example, stray magnetic fields, moving magnets, or moving iron (or, to a lesser extent, any moving metal) within the earth's or the lens' magnetic field. A typical xy stage is mechanically scanned back and forth in one direction such as the x-direction and is mechanically stepped in the orthogonal direction such as the y-direction. In order to mechanically scan and step the stage, it is typical to utilize electric linear motors that have motor coils attached to the stage and permanent magnets attached to a supporting structure. Other electromagnetic effects can detrimentally affect the magnetic field in the lens axis (i.e., where the electron beam is). Typical examples of such variations in the magnetic fields include, but are not limited to:

(a) moving magnets;
(b) moving coils with electric current flowing through them;
(c) fixed coils with alternating current flowing through them;
(d) moving conductive materials in which eddy currents form as they move in a non-uniform magnetic field; these eddy currents in turn create new magnetic fields; and
(e) iron materials which change position and thereby alter the external magnetic fields created by the electron lens optics or the earth's magnetic field.

In order to avoid these, and other, detrimental effects, added complexity must be added to the typical stage. For example, the linear motors must be located as far as possible from the electron beam and must be located symmetrically to cancel the magnetic fields created by the permanent magnets.

Accordingly, there is a need for an xy stage assembly that has drive actuators that are external to the xy stage and that are driven by motors that are also located externally to the xy stage allowing the xy stage chamber to provide magnetic shielding.

SUMMARY OF THE INVENTION

The present invention overcomes the above problems of prior art xy stage assemblies and provides other additional advantages through a method and apparatus for providing precise xy motion to an xy stage.

In one aspect of the invention an xy stage has at least one support shaft and at least one preload shaft wherein at least one of either the at least one support shaft or the at least one preload shaft is a drive shaft driving the xy state in the x direction.

Each of the at least one support shaft and each of the at least one preload shaft is supported by first and second bearings that are individually translatable in the y-direction to provide yaw to the xy stage and are individually translatable in the z-direction to provide either pitch, roll or uniform z-direction displacement to the xy stage.

In another aspect of the invention an xy stage has at least one support shaft and at least one preload shaft where at least one of either the at least one support shaft or the at least one preload shaft is a drive shaft driving the xy stage in the x direction. Each of the at least one support shaft and each of the at least one preload shaft is supported by first and second bearings that are collectively translatable in the y-direction to drive the xy stage in the y-direction.

In accordance with another aspect of the invention, either the at least one preload shaft or the at least one support shaft has at least one wheel that contacts the xy stage.

In accordance with still another aspect of the invention, the at least one wheel rides in a groove in the xy stage.

In accordance with another aspect of the invention, either the at least one preload shaft or the at least one support shaft has at least one groove in the circumference of the shaft and the xy stage has a rail on which the at least one groove in the shaft rides.

In accordance with another aspect of the invention, the xy stage is supported kinematically by the at least one preload shaft and by the at least one support shaft.

In accordance with another aspect of the invention, the xy stage is divided into two sections that are joined by a compressive layer.

In accordance with another aspect of the invention, the xy stage has a compliant contact layer on the surface of the xy stage on which the shaft rides.

In accordance with another aspect of the invention, a separate drive system drives a belt that is disposed between the xy stage and the support shafts.

The described xy stage assembly thus provides a friction drive xy stage that is precisely driven in x and y directions by drive shafts and that can have applied to it a pitch, a roll, an uniform z-axis displacement and a yaw. In addition, all sides of the xy stage can be polished mirrors to allow laser interferometer position measurements from all sides of the xy stage.

These and other advantages of the present invention will become more apparent upon a reading of the detailed description of the preferred embodiments that follow, when considered in conjunction with the drawings of which the following is a brief description. It should be clear that the drawings are merely illustrative of the currently preferred embodiments of the present invention, and that the invention is in no way limited to the illustrated embodiments. As will be realized, the invention is capable of other embodiments and its several details are capable of modifications in various obvious aspects, all without departing from the scope of the invention. The present invention is best defined by the claims appended to this specification.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE INVENTION

The following detailed description is of the presently preferred embodiments of the present invention. It is to be understood that while the detailed description is given utilizing the drawings briefly described above, the invention is not limited to the illustrated embodiments. In the detailed description, like reference numbers refer to like elements.

Figure 1:
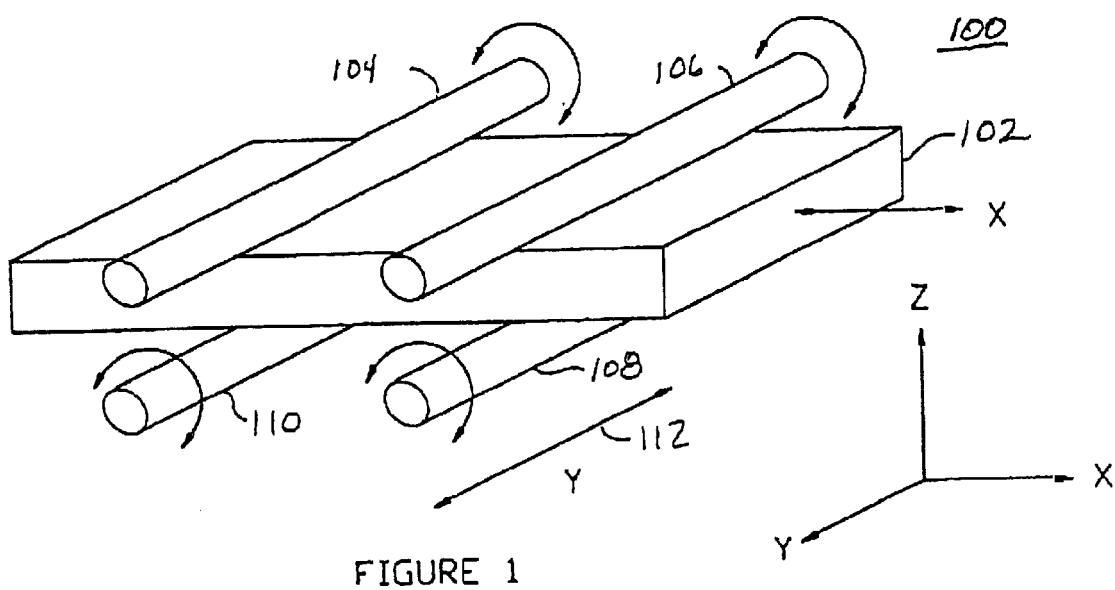
FIG. 1 shows a stage in accordance with an embodiment of the present invention with support shafts underneath the stage and preload shafts on the top of the stage.

FIG. 1 shows an xy stage assembly 100 having an xy stage 102. The xy stage is movable in the x direction by moving on rotatable shafts 104, 106, 108, and 110. One or more of the shafts 104, 106, 108, and 110 can be "drive" shafts, that is, shafts that are driven by rotary actuators. The remaining shafts rotate freely when the xy stage 102 moves in the x direction. Generally shafts above or below are preload shafts and opposing shafts are support shafts. In this and the following embodiments, the shafts on the bottom of the xy stage 108, 110 will be called support shafts and the shafts on the top of the xy stage 104, 106 will be called preload shafts, although this may be reversed. The preload shafts 104, 106 provide a load to the xy stage 102 that increases the contact force between the xy stage and the support shafts 108, 110. The drive shaft(s) can be support or preload shafts(s). For example, the xy stage 102 could have as drive shaft(s) the shaft(s) 108 and/or 110 and the shafts 104 and 106 can be passive shafts that provide a load to the xy stage 102 that increases the contact force between the xy stage 102 and the drive shafts 108 and 110. The load applied to the xy stage 102 by the preload shafts 104 and 106 increases the vertical stiffness of the interface between the drive shafts 108 and 110, which are also support shafts, and increases the maximum friction force that can be used to accelerate the stage in the x-direction. Each of the shafts 104, 106, 108, and 110 are supported outboard of the xy stage 102 by bearings in a journal (not shown). The journals and bearings can be an air journal/bearing structure, a hydrostatic journal/bearing structure, a magnetic journal/bearing structure, or a mechanical (rolling or bushing) journal/bearing structure. The shafts are precisely cylindrical so that the stage moves smoothly in the x-direction with no z-axis displacement. In order to move the xy stage in the y-direction, it is necessary to translate the shafts as indicated by arrow 112. The application of the load by preload shafts 104 and 106 also increases the maximum acceleration force which can be applied to move the shafts in the y-direction. As noted above, any combination of the shafts 104, 106, 108 and 110 can be drive shafts driven by actuators to move the xy stage in the x-direction.

Figure 2:
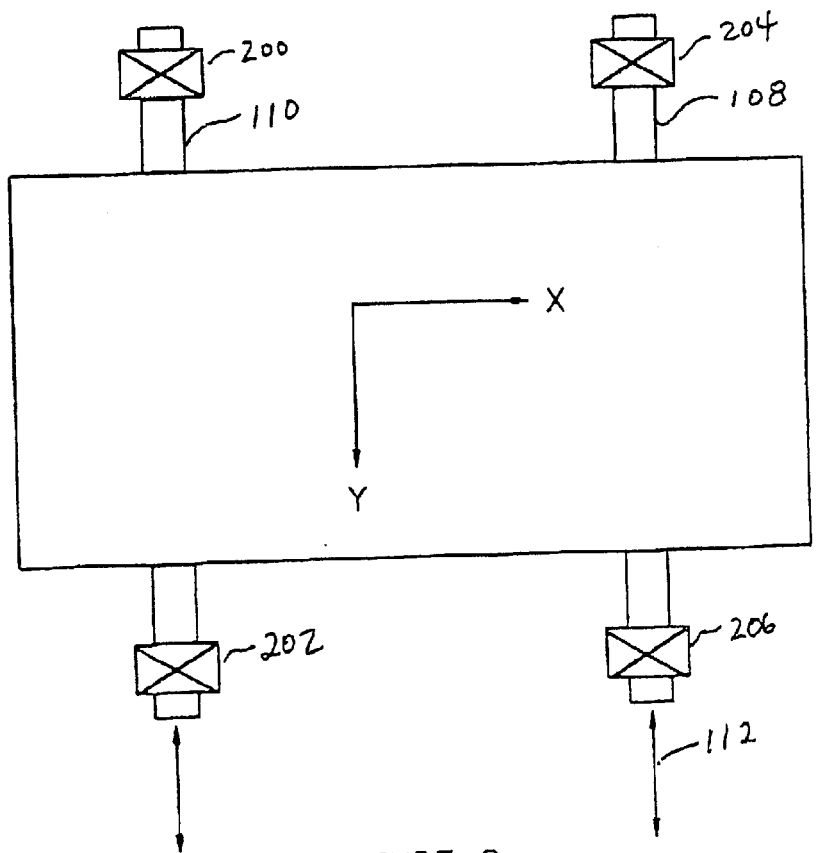
FIG. 2 is a top view of the stage shown in FIG. 1 showing the stage motion in the x and y directions.

FIG. 2 is a top view of the xy stage 102 as shown in FIG. 1. For purposes of clarity, the preload shafts 104 and 106 are not shown. Drive shaft 110 is shown with journal/bearing structures 200 and 202 and drive shaft 108 is shown with journal/bearing structures 204 and 206. A rotation of the drive shafts 108 and 110 causes the xy stage to move in the x-direction. A linear movement of the shafts 108 and 110 causes the xy stage to move in the y-direction.

FIG. 3 is a side view of an embodiment of the present invention with the xy stage 300 having alignment grooves 302 and 304 in which wheels 306 and 308 on the shaft 310 ride. The shaft 310 is supported by journal/bearing structures 312 and 314. A preload shaft 316 is shown having wheels 318 and 320. It is noted that the preload shaft 316 can also not have wheels 318 and 320. The shaft 316 is supported by journal/bearing structures 322 and 324. The alignment grooves 302 and 304 prevent undesired yaw that can result when acceleration forces applied to the xy stage 300 cause slippage at one of the friction interfaces between the drive shafts and the xy stage. When there is no slippage at the friction interfaces, the xy stage 300 would scan back and forth accurately with no drift. The alignment grooves 302 and 304 prevent drift and prevent undesired yaw, which is a rotation around the z-direction axis. It is noted that the alignment grooves can be either on the top of the xy stage 300 or on the bottom of the xy stage 300 as shown in FIG. 3. The wheels 306 and 308 that ride in the grooves 302 and 304 have a radius of curvature approximately 1–2% smaller than the radius of curvature of the corresponding grooves 302 or 304 on the xy stage 300. Two grooves are utilized to prevent undesired yaw from being imparted to the xy stage 300 due to unequal rolling radii. Since the grooves prevent undesired yaw, shaft 310 may be used as a y guide shaft for determining the amount of y movement of the xy stage 300. The y guide shaft may also be useful in preventing undesired yaw. The y guide shaft may be a drive shaft or a passive shaft.

Figure 3A:
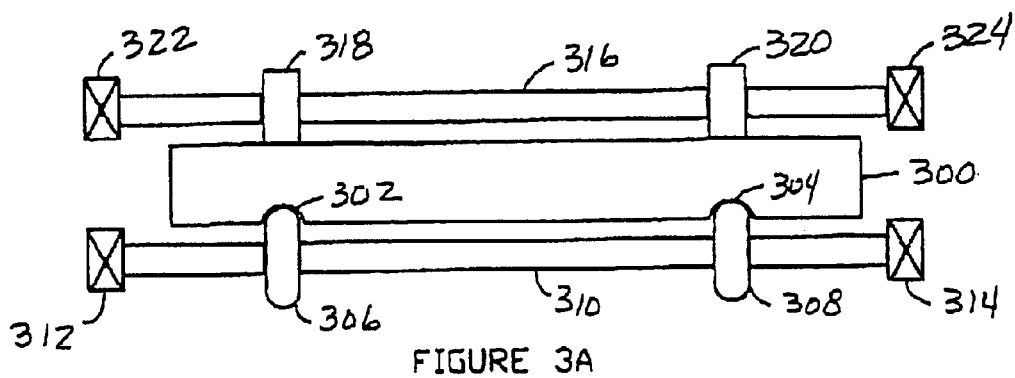
FIG. 3A is a side view of an embodiment of the present invention with the xy stage having alignment grooves.
Figure 3B:
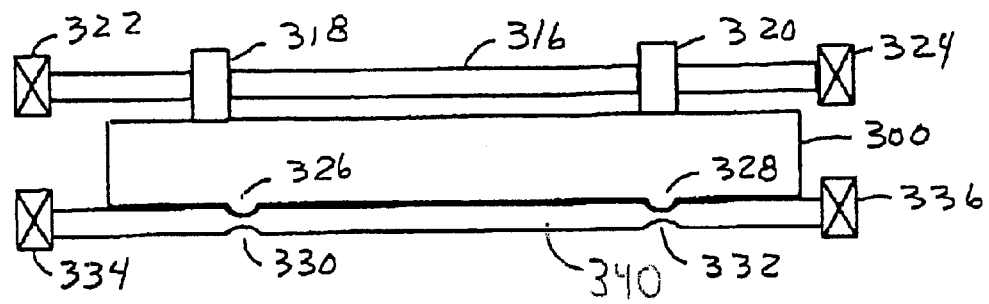
FIG. 3B is a side view of an alternative of the embodiment shown in FIG. 3A.

FIG. 3B is a side view of an alternative of the embodiment shown in FIG. 3A. The alternative xy stage 300 has raised stripes 326 and 328 that ride in grooves 330 and 332 in the shaft 340. The shaft 340 is supported by journal/bearing structures 334 and 336. Here the shaft 330 may serve as a y guide shaft.

Figure 3C:
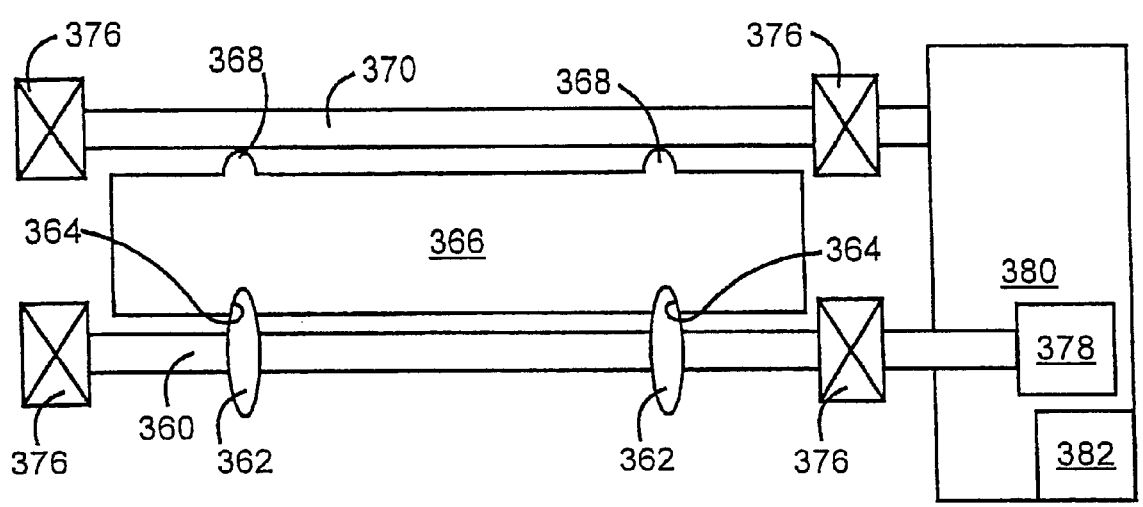
FIG. 3C is a side view of another alternative of the embodiments shown in FIG. 3A and FIG. 3B.

FIG. 3C is a side view of an alternative to the embodiments shown in FIG. 3A and FIG. 3B. The drive shaft 360, which is the support shaft 360 has wheels 362 which fit into grooves 364 on the underside of the xy stage 366. The xy stage 366 also has raised strips 368 on the top side of the xy stage, which are in contact with the preload shaft 370. The raised strips 368 are placed directly above the grooves 364 so that the load provided by preload shaft 370 is placed directly on the wheels 362. The raised strips 368 allow the xy stage 366 to have a smaller area of contact with the preload shaft 370. Bearings 376 for supporting the preload shaft 370 and the drive shaft 360 are also illustrated. A schematic illustration of a first actuator 378 is illustrated, where the first actuator 378 drives the drive shaft. The drive shaft 360 and the passive shaft 370 may be supported by a support structure 380, which may be used to support and move the drive shaft 360 and preload shaft 370, and the xy stage in the y direction or may provide pitch or yaw or roll to the xy stage. A second actuator 382 may be used to move the support structure 380 in the y direction or to provide pitch or yaw or roll. The first and second actuators may be any types of actuator, such as a hydraulic motor, electric motor, or servos that can be actuated by piezo, magnetic or other types of actuators and which may depend on the environment in which the xy stage is moved.

Figure 4:
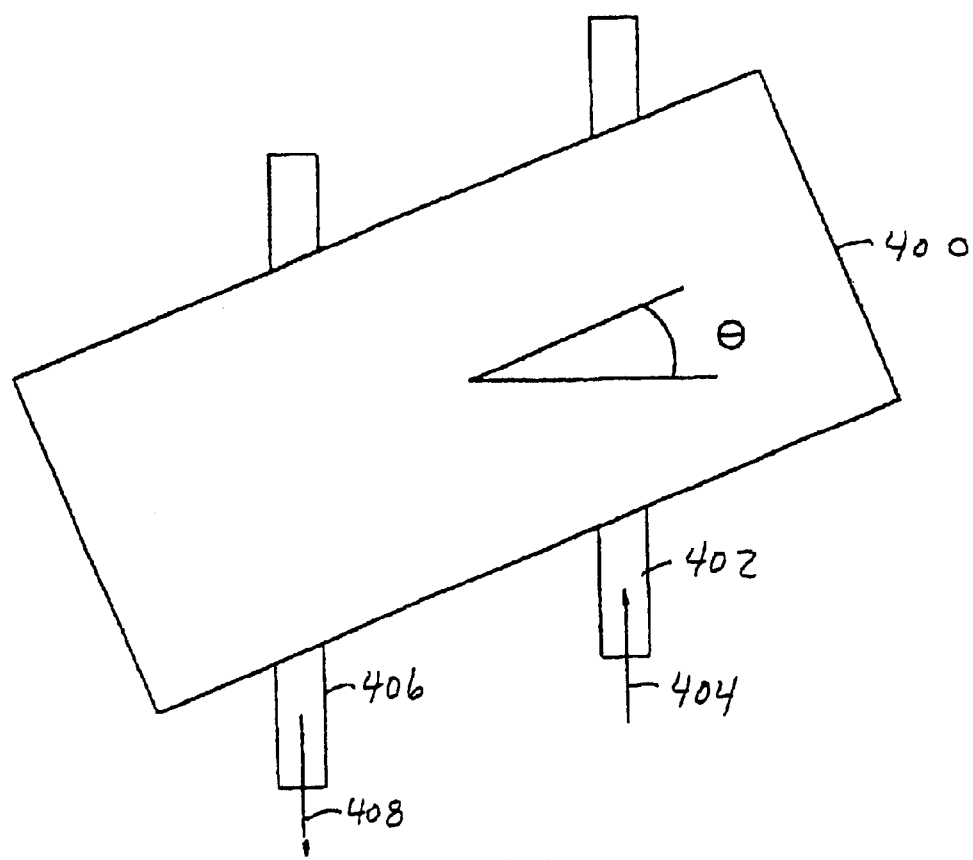
FIG. 4 is a top view of a stage with a controlled amount of yaw applied to the xy stage.

FIG. 4 shows how yaw can be applied to a stage 400. Yaw, $\theta_z$, is a rotation around the z-axis. The desired yaw angle, $\theta_z$, is achieved by moving the shaft 402 in the direction indicated by arrow 404 and by moving the shaft 406 in the opposite direction indicated by arrow 408. It should be appreciated that an opposite direction of yaw can be applied by moving the shafts 402 and 406 in the opposite directions. Such movement of the shaft may be done by a support structure which supports the shafts such as the support structure in FIG. 3.

Figure 5:
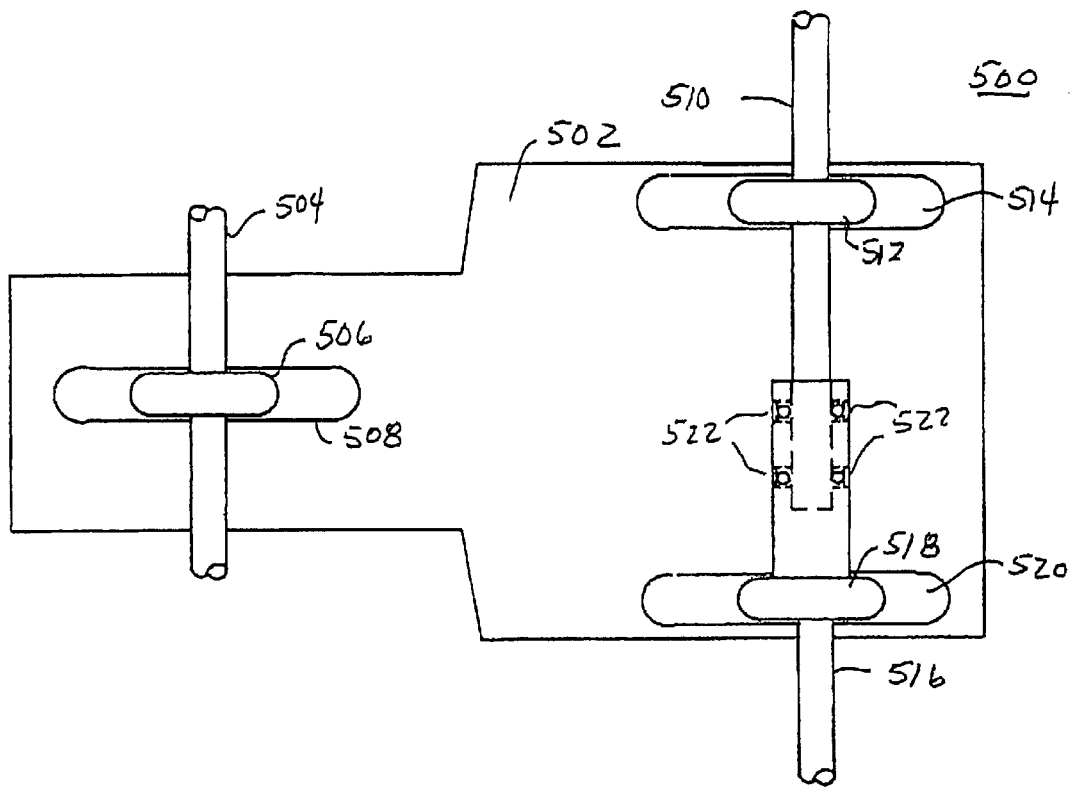
FIG. 5 is a top view of an xy stage supported kinematically by three shafts having wheels that travel in alignment grooves in the xy stage.

FIG. 5 shows an alternative embodiment of a stage assembly 500 in accordance with the present invention. Stage assembly 500 has an xy stage 502 and shaft 504 with a wheel 506 that rides in a groove 508 in the surface of the xy stage 502. The stage assembly 500 has a shaft 510 with a wheel 512 that rides in a groove 514 in the surface of the xy stage 502 and a shaft 516 with a wheel 518 that rides in a groove 520 in the surface of the xy stage 502. The three wheels support the xy stage 502 kinematically. If the shafts 510 and 516 can rotate independently, a small amount of yaw can be accommodated without any slip and corresponding wear. The method of connecting the shafts 510 and 516 as shown in FIG. 5 maintains the axial and bending stiffness of the two shafts 510 and 516. The shaft 510 is extended axially into the center of the shaft 516 and is supported by the bearing structures 522. The bearing structures 522 maintain the stiffness and allow free rotation of one shaft in relation to the other shaft. The bearings can be of any type, including: bushing, rolling element, hydrostatic, or aerostatic.

In the embodiments of the invention shown in FIGS. 1–5, the ideal configuration of the support and preload shafts to achieve high accuracy and high bandwidth in z is to have both the support and preload shafts very stiff in the z direction. The support shafts must be stiff as they define the position of the stage. However, it is difficult to manufacture support and preload shafts, the stage and its groove depths, and the shaft journal/bearing support structures within tolerances adequate to provide consistent preload if all components are stiff. A preferable method is to have one set of shafts, defined as the support shafts, with high stiffness and the opposing shafts, defined as the preload shafts, with less stiffness. The stiffer support shafts would be more preferable to use as y guide shafts. To achieve less stiffness, the opposing shafts can have a smaller diameter, be made from a less stiff material or have bearings mounted to allow vertical compliance. The mechanical interface is then adjusted to provide a consistent preload.

Figure 6:
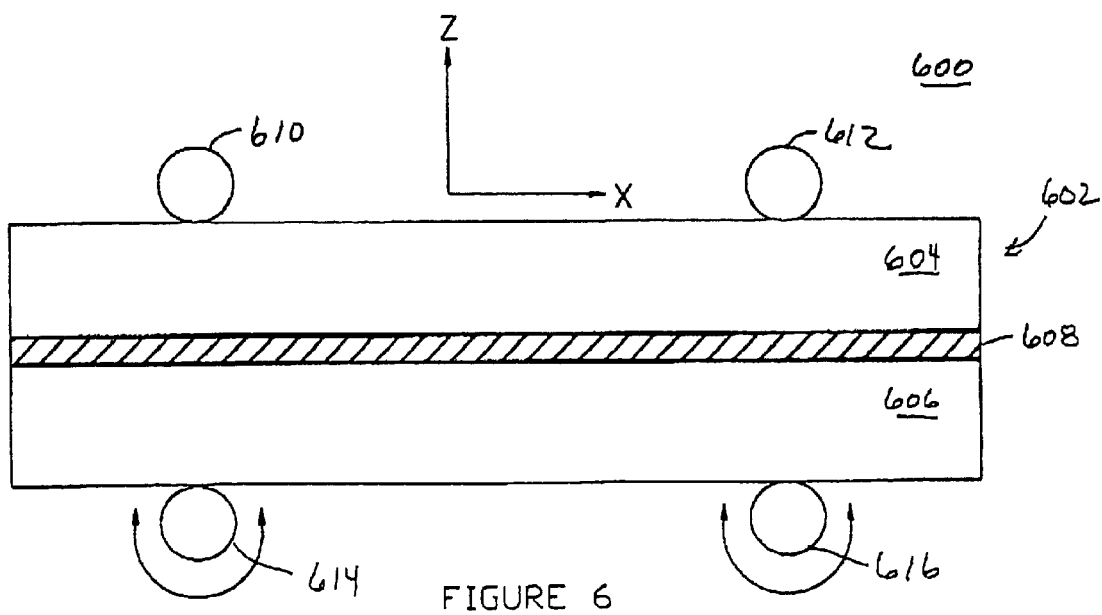
FIG. 6 is a side view of an embodiment of the present invention with the xy stage divided into two sections joined by a compressive layer.

FIG. 6 shows another method to provide some compliance to the xy stage assembly 600. The xy stage assembly 600 includes an xy stage 602 divided into two parts, an upper part 604 and a lower part 606 with a compressive layer 608 between the upper part 604 and lower part 606 of the xy stage 602. The xy stage assembly 600 includes two preload shafts 610 and 612 and two support shafts 614 and 616. The compressive layer 608 allows the support shafts 614, 616 and the preload shafts 610, 612 to be very stiff. Also, the compressive layer 608 allows the load applied by the two preload shafts 610 and 612 to be adjusted individually to attain a desired load between the xy stage 602 and the support shafts 614 and 616. In this case, the precision workpiece (wafer or reticle) should be mounted to the stage part in contact with the support shafts.

Figure 7:
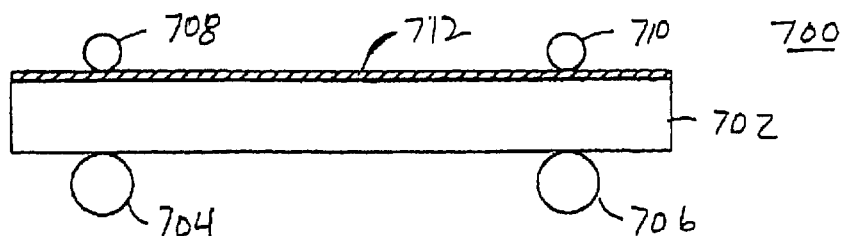
FIG. 7 is a side view of an embodiment of the present invention with the xy stage having a compliant traction layer on the surfaces of the xy stage on which the drive shafts contact the xy stage.

FIG. 7 illustrates an xy stage assembly 700 having an xy stage 702, two passive support shafts 704 and 706, two preload drive rollers 708 and 710 and a traction layer 712 on the xy stage 702. The traction layer 712 provides high tractive forces between the preload drive rollers 708 and 710 and the xy stage 702 for high-g acceleration applications. Preload force is equal to the (safety factor)×(stage mass)×(stage acceleration)/(coefficient of friction). However, many high-specific-stiffness materials such as ceramics that are appropriate for xy stage structures have low coefficients of friction. This is also exacerbated by the fact that to achieve smooth, noise-free and precise motion it is necessary to highly polish the contact surfaces. The xy stage assembly 700 allows the use of very stiff ceramic-on-ceramic contact for support, precision, and stiffness and a compliant contact layer for the high traction required for high-g acceleration applications. The compliant contact layer can be a thin, soft strip with relatively high coefficient of friction along the stage where the preload shaft contacts. This strip must be thin to minimize shear compliance that would reduce the achievable servo bandwidth. This material must be chosen very carefully to prevent or minimize particulate generation. The preferable materials are those materials that have high coefficients of friction when in contact with like materials. In order to prevent detrimental bending moments which can distort the precise relationship between interferometer mirrors and the workpiece, the roller contacts of the support shaft must be directly opposite from the roller contacts of each corresponding preload shaft. Since the traction layer 712 may provide some variation in movement, the support shafts 704 and 706 are preferably used as y guide shafts.

In an alternative embodiment, the traction layer may be placed on the bottom side of the xy stage. In such a case, the drive shafts are placed on the bottom of the xy stage. Passive shafts, which may also be y guide shafts, are placed on the top of the xy stage. The advantages to this alternative is that particle generation occurs on the bottom of the xy stage and the work piece may be placed on the top side of the xy stage to minimize contamination by particles. In addition, the weight of the xy stage adds additional preload for added traction.

Figure 8:
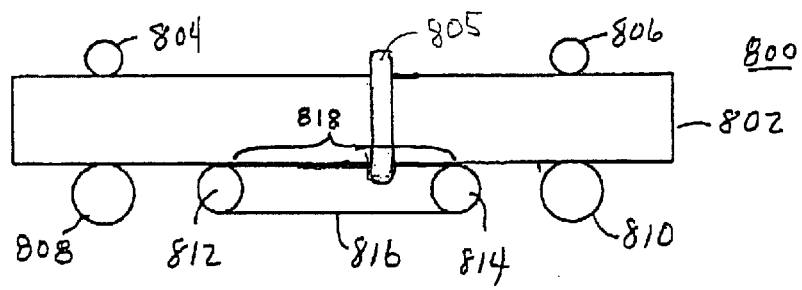
FIG. 8 is a side view of an embodiment of the present invention having a belt-type drive.

FIG. 8 shows an xy stage assembly 800 having an xy stage 802, two preload shafts 804 and 806, two support shafts 808 and 810, and two shafts 812 and 814 that drive a belt 816. The belt 816 may be connected to the xy stage 802 by a connection device 805 such as a clamp. The connection is preferably along a line in the y direction. The maximum movement of the xy stage 802 is a movement that keeps the connection device 808 within the illustrated region 818. The belt drive is in addition to the normal friction drive system because the compliance (stretch) in the belt 816 makes the belt 816 much less stiff than the friction contact. During precise positioning or scanning (after the peak acceleration periods), the belt drive can coast and the high bandwidth control is attained through the friction drive. One advantage of the belt system is that the load applied to the xy stage 800 by the preload shafts 804 and 806 can be reduced without increasing the chance of slipping at the contact. The rotational position and velocity of the rollers 804, 806, 808, 810 and the belt drives 812 and 814 are not directly related, where the difference in such movement is related to the stretch in the belt 816.

Figure 9:
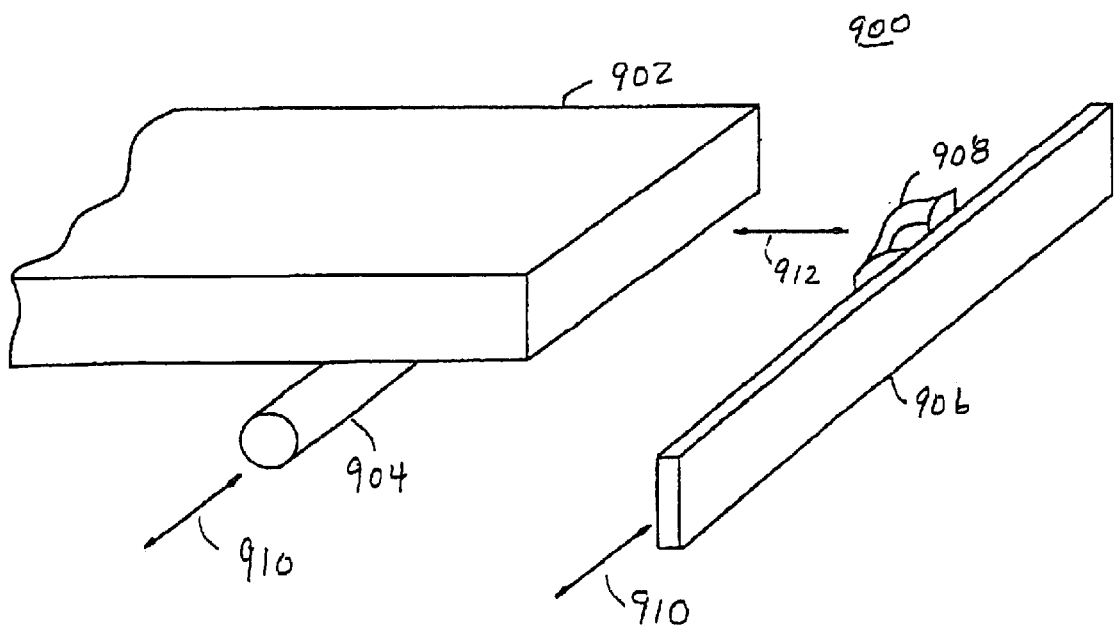
FIG. 9 shows a partial view of an embodiment of the present invention in which an external structure includes a spring for the xy state to "bounce off" of the supporting frame at the end of scan.

FIG. 9 shows a portion of an xy stage assembly 900 showing a portion of an xy stage 902, one support shaft 904 and a section of an external frame 906. The section of the external frame 906 has a spring structure 908 that serves to store kinetic energy when the xy stage 902 hits the spring structure 908 and releasing the energy to the xy stage 902 to assist in accelerating the xy stage 902 in the opposite direction. The spring structure 908 should be of a form that minimizes friction and hysteresis. As shown, the section of the external frame 906 and the spring structure 908 moves with the xy stage 902 in the y direction so that the force vector to and from the spring structure 908 is always through the center of gravity of the xy stage 902. The arrows 910 show the movement of the shaft 904 and the external frame 906. It should be appreciated that the shaft 904 and external frame 906 move together. The arrow 912 shows how the xy stage 902 moves.

Figure 10A:
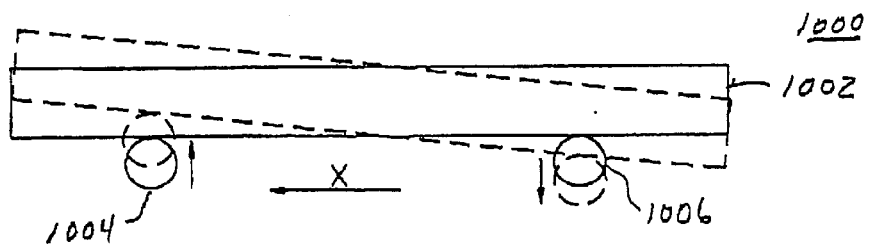
FIG. 10A illustrates how pitch is applied to an xy stage.

FIG. 10A illustrates pitch about the y axis applied to an xy stage assembly 1000. Solid lines show the xy stage 1002 and shafts 1004 and 1006 without pitch. Dashed lines show the xy stage 1002 and shafts 1004 and 1006 with pitch applied to the stage by elevating shaft 1004 and lowering shaft 1006. It is noted that the amount of pitch applied to the xy stage 1002 is shown greatly exaggerated for purposes of illustration. Pitch is defined by a rotation around the axis orthogonal to the scan axis. In this case, the scan axis is the x-axis and therefore pitch is a rotation around the y-axis, which is an axis in and out of the plane of the drawing.

Figure 10B:
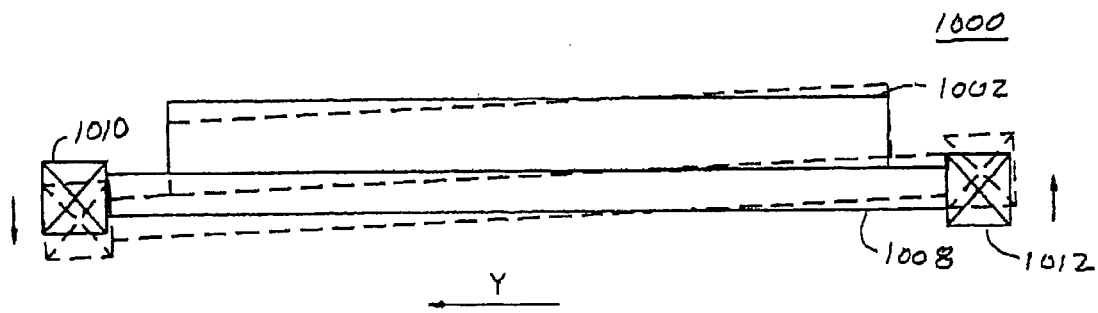
FIG. 10B illustrates how roll is applied to an xy stage.

FIG. 10B illustrates roll about the x axis applied to the xy stage assembly 1000. Solid lines show the xy stage 1002, a shaft 1008 and two journal/bearing structures 1010 and 1012 for the shaft 1008 without roll. Dashed lines show the xy stage 1002, shaft 1008 and the two journal/bearing structures 1010 and 1012 with roll applied to the stage by elevating the journal/bearing structure 1012 and lowering journal/bearing structure 1010. It is noted that the amount of roll applied to the xy stage 1002 is shown greatly exaggerated for purposes of illustration. The roll is defined by a rotation around the scan axis. In this case, the scan axis is the x-axis and therefore roll is a rotation around the x-axis.

Figure 10C:
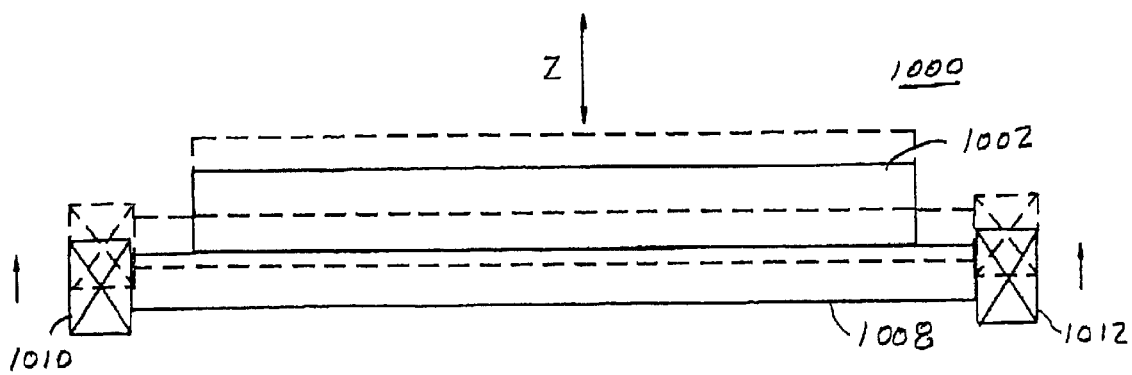
FIG. 10C illustrates how a change in the z-axis direction is achieved.

FIG. 10C illustrates a displacement in the z-axis direction of the xy stage assembly 1000. Solid lines show the xy stage 1002, shaft 1008 and journal/bearing structure 1010 and 1012 without a displacement in the z-axis direction. Dashed lines show the xy stage 1002, shaft 1008 and journal/bearing structures 1010 and 1012 with a displacement in the z-axis direction. It is to be noted that pitch, roll and z-axis displacement is applied by moving the support shaft bearings. The bearings can be moved together or individually, which allow pitch, roll and z-axis displacement to be applied in any combination, that is, for example, a pitch, a roll and an x-axis displacement can be applied simultaneously. The bearings can be mounted to a support structure with flexures that allow vertical travel. The flexures are controlled by servos that can be actuated by piezo, magnetic or other types of actuators.

In summary, the results and advantages of the xy stage assembly of the present invention can now be more fully realized. The present invention provides a friction-drive xy stage that can be driven in the x and y directions with precision and can have applied to it pitch, roll, yaw and a uniform z axis displacement. In addition, the present invention allows all sides of the xy stage to be polished mirrors to allow laser interferometer position measurements from all four sides.

Although standard convention may provide scanning in the y direction and stepping in the x direction, the prior art may not have been interchangeable allowing scanning in the x direction and stepping in the y direction. Some of the above embodiments provide scanning in both the x and y direction and stepping in both x and y direction. An advantage of scanning in the x direction, as shown in FIG. 2, is that the mass is reduced. An advantage of scanning in the y, as shown in FIG. 2, is that a lower friction and rolling noise may be provided if aerostatic or hydrostatic journal bearings are used on shafts.

Figure 11:
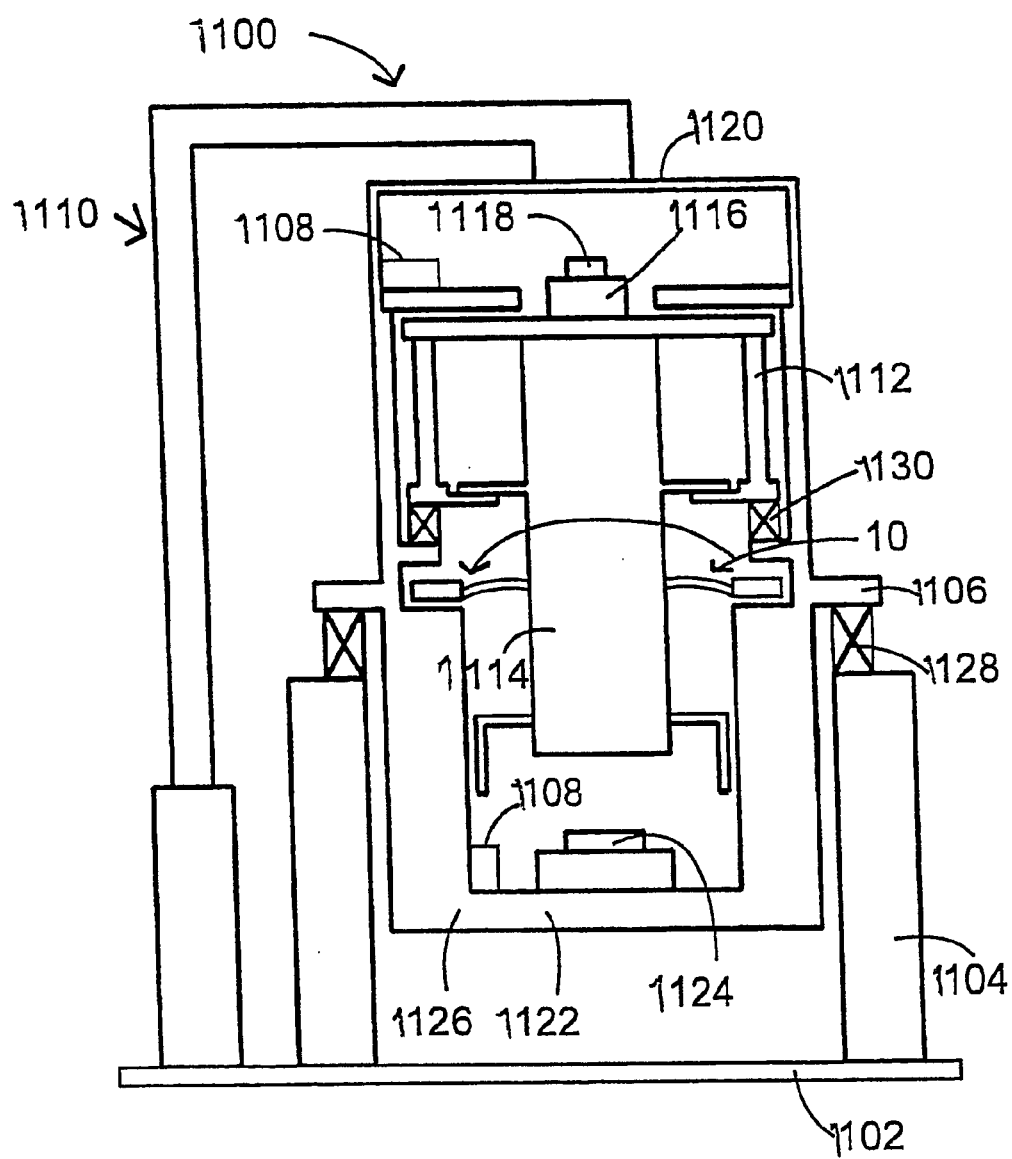
FIG. 11 illustrates an exemplary lithographic exposure system.

Referring next to FIG. 11, one exemplary lithographic exposure system that incorporates the present invention will be briefly described. A typical exposure apparatus 100 includes a mounting base 1102, a support frame 1104, a base frame 1106, a measurement system 1108, a control system (not shown), an illumination system 1110, an optical frame 1112, an optical device 1114, a reticle stage 1116 for retaining a reticle 1118, an upper enclosure 1120 surrounding reticle stage 1116, a wafer stage 1122 for retaining a semiconductor wafer workpiece 1124, and a lower enclosure 1126 surrounding wafer stage 1122.

Support frame 1104 typically supports base frame 1106 above mounting base 1102 through a base vibration isolation system 1128. Base frame 1106 in turn supports, through an optical vibration isolation system 1130, optical frame 1112, measurement system 1108, reticle stage 1116, upper enclosure 1120, optical device 1114, wafer stage 1122, and lower enclosure 1126 above base frame 1106. Optical frame 1112 in turn supports optical devise 1114 and reticle stage 1116 above base frame 1106 through optical vibration isolation system 1130. As a result thereof, optical frame 1112 and its supported components and base frame 1106 are effectively attached in series through base vibration isolation system 1128 and optical vibration isolation system 1130 to mounting base 1102. Vibration isolation systems 1128 and 1130 are designed to damp and isolate vibrations between components of exposure apparatus 1100. Measurement system 1108 monitors the positions of stages 1116 and 1122 relative to a reference such as optical device 1114 and outputs position data to the control system. Optical device 1114 typically includes a lens assembly that projects and/or focuses the light or beam from an illumination system 1110 that passes through reticle 1118. Reticle stage 1116 is attached to one or more movers (not shown) directed by the control system to precisely position reticle 1118 relative to optical device 1114. Similarly, wafer stage 1122 includes one or more movers (not shown) to precisely position the wafer workpiece 124 relative to optical device (lens assembly) 1114. Seals 10 are placed between base frame 1106 (the upper enclosure 1120) and the lens assembly 1114.

As will be appreciated by those skilled in the art, there are a number of different types of photolithographic devices. For example, exposure apparatus 1100 can be used as a scanning type photolithography system which exposes the pattern from reticle 1118 onto wafer 1124 with reticle 1118 and wafer 1124 moving synchronously. In a scanning type lithographic device, reticle 1118 is moved perpendicular to an optical axis of lens assembly 1114 by reticle stage 1116 and wafer 1124 is moved perpendicular to an optical axis of lens assembly 1114 by wafer stage 1122. Scanning of reticle 1118 and wafer 1124 occurs while reticle 1118 and wafer 1124 are moving synchronously.

Alternately, exposure apparatus 1100 can be a step-and-repeat type photolithography system that exposes reticle 1118 while reticle 1118 and wafer 1124 are stationary. In the step and repeat process, wafer 1124 is in a constant position relative to reticle 1118 and lens assembly 1114 during the exposure of an individual field. Subsequently, between consecutive exposure steps, wafer 1124 is consecutively moved by wafer stage 1122 perpendicular to the optical axis of lens assembly 114 so that the next field of semiconductor wafer 1124 is brought into position relative to lens assembly 1114 and reticle 1118 for exposure, Following this process, the images on reticle 1118 are sequentially exposed onto the fields of wafer 1124 so that the next field of semiconductor wafer 1124 is brought into position relative to lens assembly 1114 and reticle 1118.

However, the use of exposure apparatus 1100 provided herein is not limited to a photolithography system for a semiconductor manufacturing. Exposure apparatus 1100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source (of illumination system 1110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to lens assembly 1114, when far ultra-violet rays such as the excimer laser is used, glass materials such as quartz and fluorite that transmit far ultra-violet rays is preferably used. When the $F_2$ type laser or x-ray is used, lens assembly 1114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 12:
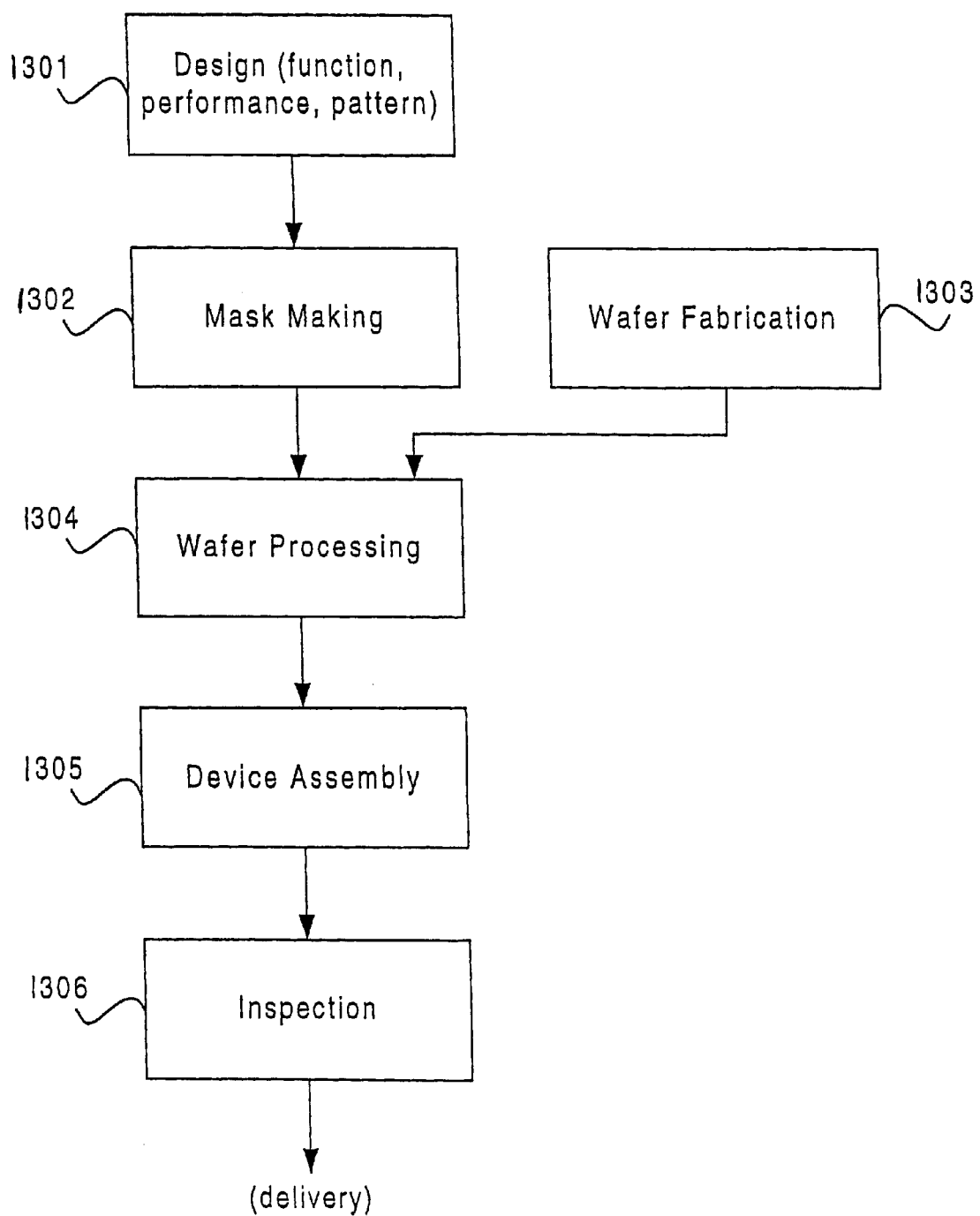
FIG. 12 is a flow chart of a fabrication process.

Further, semiconductor devices can be fabricated using the above described systems, by the process shown generally in FIG. 12. In step 1301 the device's function and performance characteristics are designed. Next, in step 1302, a mask (reticle) having a pattern it designed according to the previous designing step, and in a parallel step 1303, a wafer is made from a silicon material. The mask pattern designed in step 1302 is exposed onto the wafer from step 1303 in step 1304 by a photolithography system such as the systems described above. In step 1305 the semiconductor device is assembled (including the dicing process, bonding process and packaging process), then finally the device is inspected in step 1306.

Figure 13:
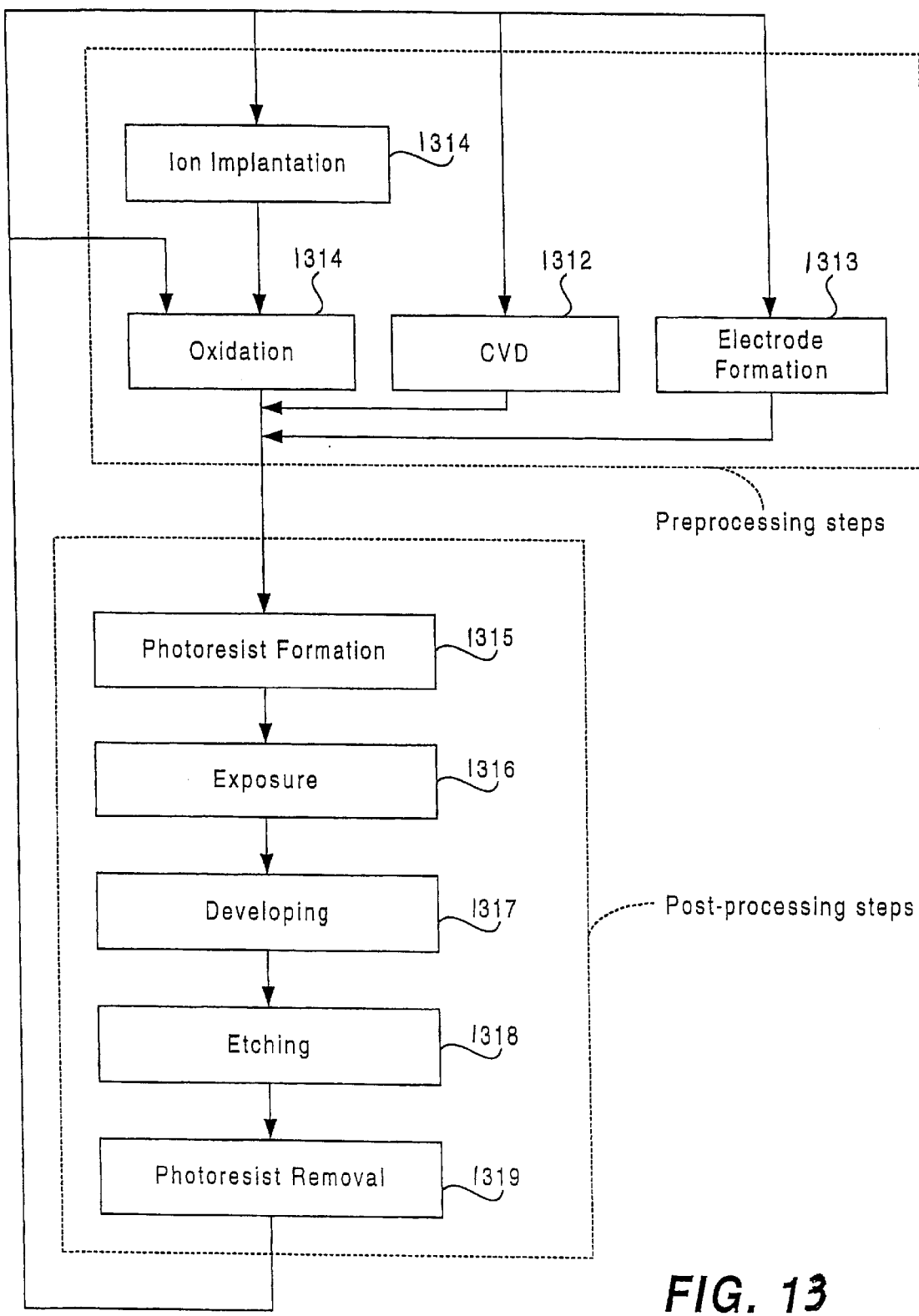
FIG. 13 is a flow chart of detailed flow chart of a wafer processing step.

FIG. 13 illustrates a detailed flowchart example of the above-mentioned step 1304 in the case of fabricating semiconductor devices. In step 1311 (oxidation step), the wafer surface is oxidized. In step 1312 (CVD step), an insulation film is formed on the wafer surface. In step 1313 (electrode formation step), electrodes are formed on the wafer by vapor deposition. In step 1314 (ion implantation step), ions are implanted in the wafer. The above mentioned steps 1311–1314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 1315 (photoresist formation step), photoresist is applied to a wafer. Next, in step 1316, (exposure step), the above-mentioned exposure device is used to transfer the circuit pattern of a mask (reticle) to a wafer. Then, in step 1317 (developing step), the exposed wafer is developed, and in step 1318 (etching step), parts other than residual photoresist (exposed material surface) are removed by etching. In step 1319 (photoresist removal step), unnecessary photoresist remaining after etching is removed. Multiple circuit patterns are formed by repetition of these preprocessing and post-processing steps.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modification as are suited to the particular use contemplated. All such modifications and variations are within the scope of the invention as determined by the appended claims when interpreted in accordance with the breadth to which they are fairly, legally, and equitably entitled.

What is claimed is:

1. An xy stage assembly comprising:

an xy stage;

at least one support shaft supporting the xy stage;

at least one preload shaft applying a load to the xy stage; and wherein at least one of either the at least one support shaft or the at least one preload shaft is a drive shaft that drives the xy stage in an x axis direction, wherein each of the at least one support shaft and the at least one preload shaft is supported by first and second journal/bearing structures on each end of the at least one support shaft and on each end of the at least one preload shaft, wherein the journal/bearing structures are translatable in a y-axis direction, wherein the y-axis direction is a direction parallel to the axis of the at least one support shaft and to the axis of the at least one preload shaft.

2. The xy stage assembly claim 1 wherein each of the first and second journal/bearing structures on each end of the at least one support shaft and on each end of the at least one preload shaft is translatable in a z-axis direction, wherein the z-axis is an axis orthogonal to the x-axis and to the y-axis.

3. The xy stage assembly of claim 1 wherein each of the at least one preload shaft has at least two wheels that contact the xy stage.

4. The xy stage assembly of claim 3 wherein the xy stage has at least two grooves in which the at least two wheels on the at least one preload shaft ride.

5. The xy stage assembly of claim 1 wherein each of the at least one support shaft has at least two wheels that contact the xy stage.

6. The xy stage assembly of claim 5 wherein the xy stage has at least two grooves in which the at least two wheels on the at least one support shaft ride.

7. The xy stage assembly of claim 1 wherein:

the at least one support shaft has at least two grooves in the circumference of the support shaft; and the xy stage has at least two rails on which the at least two grooves in the circumference of the support shaft ride.

8. The xy stage assembly of claim 1 wherein:

the at least one preload shaft has at least two grooves in the circumference of the preload shaft; and the xy stage has at least two rails on which the at least two grooves in the circumference of the preload shaft ride.

9. The xy stage assembly of claim 1 wherein each of the first and second journal/bearing structures on each end of the support shaft and on each end of the at least one preload shaft is individually translatable in a z-axis direction, wherein translating one or more of the first and second journal/bearing structures provides a pitch to the xy stage and translating one or more of the first and second journal/bearing structures provides a roll to the xy stage and translating all of the one or more of the first and second journal/bearing structures provides a uniform translation in the y direction.

10. An xy stage assembly comprising:

an xy stage;

at least one support shaft supporting the xy stage;

at least one preload shaft applying a load to the xy stage; and wherein at least one of either the at least one support shaft or the at least one preload shaft is a drive shaft that drives the xy stage in an x axis direction, each of the at least one support shaft has at least two wheels that contact the xy stage wherein the xy stage has at least two grooves in which the at least two wheels on the at least one support shaft ride.

11. An xy stage assembly, comprising:

an xy stage;

at least one support shaft supporting the xy stage;

at least one preload shaft applying a load to the xy stage;

wherein at least one of either the at least one support shaft or the at least one preload shaft is a drive shaft that drives the xy stage in an x axis direction, an illumination source spaced apart form the xy stage, an optical system spaced between the illumination source and the optical system; and a reticle stage arranged to retain a reticle, wherein the xy stage is arranged to support a workpiece.

12. An xy stage assembly, comprising:

an xy stage;

a plurality of shafts, wherein at least two of the plurality of shafts is a support shaft for supporting the xy stage and at least one shaft of the plurality of shafts is a preload shaft;

a first actuator for driving at least one of the plurality of shafts to move the xy stage in a first direction;

a support structure for moving the plurality of shafts in a second direction perpendicular to the first direction;

an illumination source spaced apart form the xy stage, an optical system spaced between the illumination source and the optical system; and a reticle stage arranged to retain a reticle, wherein the xy stage is arranged to support a workpiece.

* * * * *